April 22, 1969

F. J. SAIA ET AL

SURFACE-PROTECTED SEMICONDUCTOR DEVICES
AND METHODS OF MANUFACTURING

Filed July 20, 1965

3,440,496

Frank J. Saia,
John G. Quetsch,
INVENTORS.

BY. W. H. McAllister, Jr.
ATTORNEY.

3,440,496

SURFACE-PROTECTED SEMICONDUCTOR DEVICES AND METHODS OF MANUFACTURING

Frank J. Saia, Costa Mesa, and John G. Quetsch, Anaheim, Calif., assignors to Hughes Aircraft Company, Culver City, Calif., a corporation of Delaware Filed July 20, 1965, Ser. No. 473,374
Int. Cl. H01l 3/00, 5/00
U.S. Cl. 317—234 9 Claims

ABSTRACT OF THE DISCLOSURE

Planar junction type semiconductor device having a protective coating over the junction surface formed in the order named by superimposed layers of thermally grown silicon oxide, glass (borosilicate), and pyrolytically deposited silicon oxide.

This invention relates to semiconductor devices and especially to planar junction-type silicon diodes. More particularly, the invention relates to planar diffused silicon diodes and to methods of manufacturing and treating such diodes so as to improve and stabilize their electrical and physical characteristics.

Diffused junction-type silicon diodes comprising a body of N-type silicon having a P-type conductivity region formed in one surface thereof by diffusion of a P-type impurity through a silicon oxide mask are well known. It is also well known to leave the oxide mask in situ on the surface of the silicon body except for an opening in the mask to permit electrical connection to the diffused region, so as to protect this surface and especially the P-N rectifying junction which terminates thereat. While a silicon oxide mask is efficacious in protecting the device thus formed and is, in many applications, as in microcircuitry or integrated circuit arrangements, the only protection needed, there are other applications where additional protection against mechanical damage or detrimental environments is needed. It has therefore been proposed to apply and bond an additional protective layer over and to the silicon oxide mask which additional protective layer may be of glass, for example. It has also been proposed to provide such an additional protective layer by pyrolytically forming a much thicker layer of silicon oxide over the initial silicon oxide mask. Finally, it is also known to provide a diode device having such additional protection as just described in a hermetically sealed package comprising a small tubular envelope and a pair of metallic end caps. Electrical connections between the diode and the end caps are achieved by contacting or bonding the silicon body to the inside surface of one of the end caps and by contacting or bonding the electrically conductive connection from the diffused junction-forming region in the silicon body which extends through the protective layers to the inside surface of the other end cap.

When protection of the junction-containing surface of the silicon body is achieved by using only silicon oxide, and especially with a thick layer or layers of such silicon oxide, it has been found that the $SiO_2$ layer or layers tend to craze. This is apparently because silicon oxide has a low coefficient of thermal expansion in comparison with the expansion coefficient of the bulk silicon body. It has been found that this problem may be solved by adding another oxide over the silicon oxide layer which second oxide has a larger coefficient of thermal expansion than that of the silicon oxide and which is more compatible with the expansion coefficient of silicon. A typical example of such an oxide is boron trioxide ($B_2O_3$) which, when fused to the underlying $SiO_2$ layer, forms a borosilicate.

However, while this arrangement solves the problem of crazing due to differences in the coefficients of thermal expansion, it has been found that most silicates, and especially the borosilicates, are attacked very rapidly by the etching solutions (i.e., hydrofluoric acid) employed to form an opening through the borosilicate and underlying silicon layers to permit electrical connection to the underlying diffused region. Thus the borosilicate protective layer is etched not only vertically but laterally as well to an excessive extent. Furthermore, the borosilicate is less chemically resistant to detrimental environments and may be subject to deterioration in use when exposed to different environmental conditions.

It is therefore an object of the present invention to provide an improved method for fabricating oxide-protected diffused junction semiconductor devices.

Another object of the invention is to provide an improved oxide-protected diffused junction semiconductor device.

Still another object of the invention is to provide an improved method for fabricating and protecting oxide-protected diffused junction silicon diodes.

Another object of the invention is to provide an improved diffused junction silicon device having an oxide-protected surface which has a coefficient of thermal expansion more compatible with that of the silicon body and which is chemically resistant.

These and other objects and advantages of the invention are realized by providing the silicon body with an initial layer of silicon oxide having an opening therethrough to permit the establishment of a diffused junction-forming region in the silicon body under the mask. After this diffusion step, the opening may then be closed with additional oxide formed by heating the silicon body in an oxygen atmosphere. Thereafter, an additional oxide layer, different from silicon oxide, and which may be $B_2O_3$, for example, is coated over the silicon oxide layer to form a borosilicate glass coating therewith and thereover. The borosilicate layer is then covered with a thin layer of $SiO_2$ which may be formed by pyrolytically decomposing a material which yields the requisite silicon oxide. Thereafter, openings may be made through the layered structures just described to permit electrical connection to the underlying diffused region by electrodepositing a metal through such opening, for example.

The invention will be described in greater detail by reference to the drawings in which.

Figure 1:
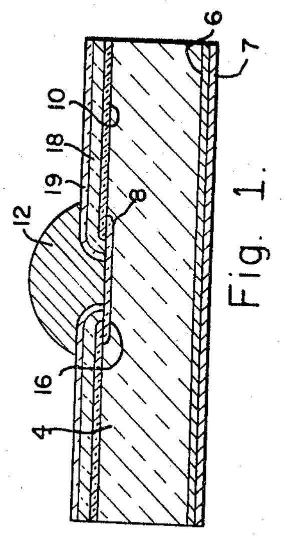
FIGURE 1 is a cross-sectional elevational view of a typical diode device having the surface-protecting layered structure of the invention.

Referring now to FIGURE 1, a typical semiconductor diode device is shown as processed according to the present invention. The diode device 2 may comprise, for example, a silicon crystal member 4, the bulk of which may be of N-type conductivity. The "back" surface of the silicon member or die 4 may be provided with a bonded metallic connection comprising a gold-silicon eutectic layer 6 by processing techniques well known in the art of semiconductor device fabrication in order to insure a good ohmic connection to the N-type semiconductor die 4. The gold-silicon eutectic layer 6 may be provided by evaporating a thin layer of gold onto the back surface of the silicon body while maintaining this body at the gold-silicon eutectic temperature. Thereafter, by conventional techniques, a thin layer 7 of silver may be electrodeposited on the gold-silicon layer 6.

The remainder of the diode device 2 comprises a diffused P-type junction-forming region 8 disposed on the upper surface of the semiconductor die 4 with protective nonconductive coatings 10, 18 and 19 disposed over portions thereof including especially those portions where the junction 16 between the P-type region 8 and the bulk of the N-type body 4 extends to the surface of the semiconductor die. This junction-forming P-type region 8 is formed by masking the upper surface of the silicon die 4 with a nonconductive coating 10 as by oxidizing this surface. This process is well known in the art and is fully described in U.S. Patents 2,802,760 to Derick and Frosch and 3,025,589 to Hoerni and the silicon oxide coating provided on the immediate surface of the silicon body 4 is about 1.5 microns in thickness. A portion of this coating 10 may be removed, as by etching, to form an opening or window therein. Thereafter the thus-masked surface of the silicon die is exposed to a diffusion atmosphere containing in vapor form a P-type impurity such as boron, for example. By the process of diffusion, the impurity establishes the P-type region 8 through the opening in the mask. The P-N rectifying junction 16 is thus formed under the protective oxide layer 10 which is left in situ. Thereafter the opening in the oxide layer 10 may be closed with additional silicon oxide which may be formed again by heating the silicon body in an oxygen atmosphere as was done to form the mask layer 10 in the first instance. Because of the method of forming this oxide and in view of the fact that the present diode device includes a plurality of layers, this first oxide layer 10 is hereinafter identified as the thermal silicon oxide layer.

In order to provide a substantially thick layer of insulating material over the P-N rectifying junction 16 as well as the entire upper surface of the silicon body 4, an additional oxide layer, different from silicon oxide, is coated over the silicon oxide layer 10 to form a borosilicate glass coating 18 thereover. As explained previously, the borosilicate glass formed has a thermal coefficient of expansion which is substantially a much closer match to the thermal coefficient of the bulk silicon body 4. The thickness of the borosilicate layer 18 is approximately 1.5 microns. The borosilicate layer 18 is formed by the decomposition in vacuum of tetraethylorthosilicate containing from 1–20% of trimethylborate by volume. An atmosphere containing these materials is established in vacuum with the silicon body 4 which is heated to about 800–825° C. which causes the decomposition at the surface of the silicon body so as to form a borosilicate glass layer over the thermal oxide layer 10. The borosilicate glass layer 18 may be densified by heating the silicon body 4 to a temperature of from 1000–1050° C. in steam or oxygen for about 15–60 minutes at this stage of processing, if desired, or delayed until after the next step in the process.

After the borosilicate glass layer has been formed, an additional layer 19 of silicon oxide is formed over the borosilicate layer 18 by thermally decomposing tetraethylorthosilicate. This oxide layer 19 along with the borosilicate glass layer 18 may then be densified by heating the thus-coated silicon body 4 in an atmosphere of steam, if desired. According to the present invention, the silicon oxide layer 19, which may be referred to as the pyrolytic oxide, is approximately .4 micron in thickness, its purpose is to provide a chemically durable coating over the less chemically resistant borosilicate glass layer 18.

After the formation of the three layers thus described, an opening may be made through the layered structures 10, 18 and 19 to permit electrical connection to the underlying diffused region 8 by electrodepositing a metal through such an opening, for example. The opening may be formed by photoresist masking techniques and etching with hydrofluoric acid which is a procedure well known in the art.

Electrical contact to the P-type region 8 is provided by means of a metal fill or "bump" 12 through openings provided in the nonconductive coatings 10, 18 and 19. Semiconductor devices such as shown are extremely small, the area of the surface of the die member 4 containing the junction-forming region 8 being about 400 sq. mils. In such a device, it is customary that the opening in the nonconductive mask coatings 10, 18 and 19 be only about 3.5 mils in diameter. Electrical connection to the exposed surface of the die member through the window in the nonconductive coatings 10, 18 and 19 is provided by electroplating.

While a single such device may be fabricated on a discrete semiconductor body or die, it has been found more convenient and economical to perform the required fabrication process on a large wafer of semiconductor material and form a plurality of rectifying junction devices simultaneously and thereafter "dice" the wafer to obtain separate devices or dies. Thus it should be understood that, though the process of the invention is described as being performed on a discrete semiconductor device or body, the practice is by no means limited thereto.

Figure 2:
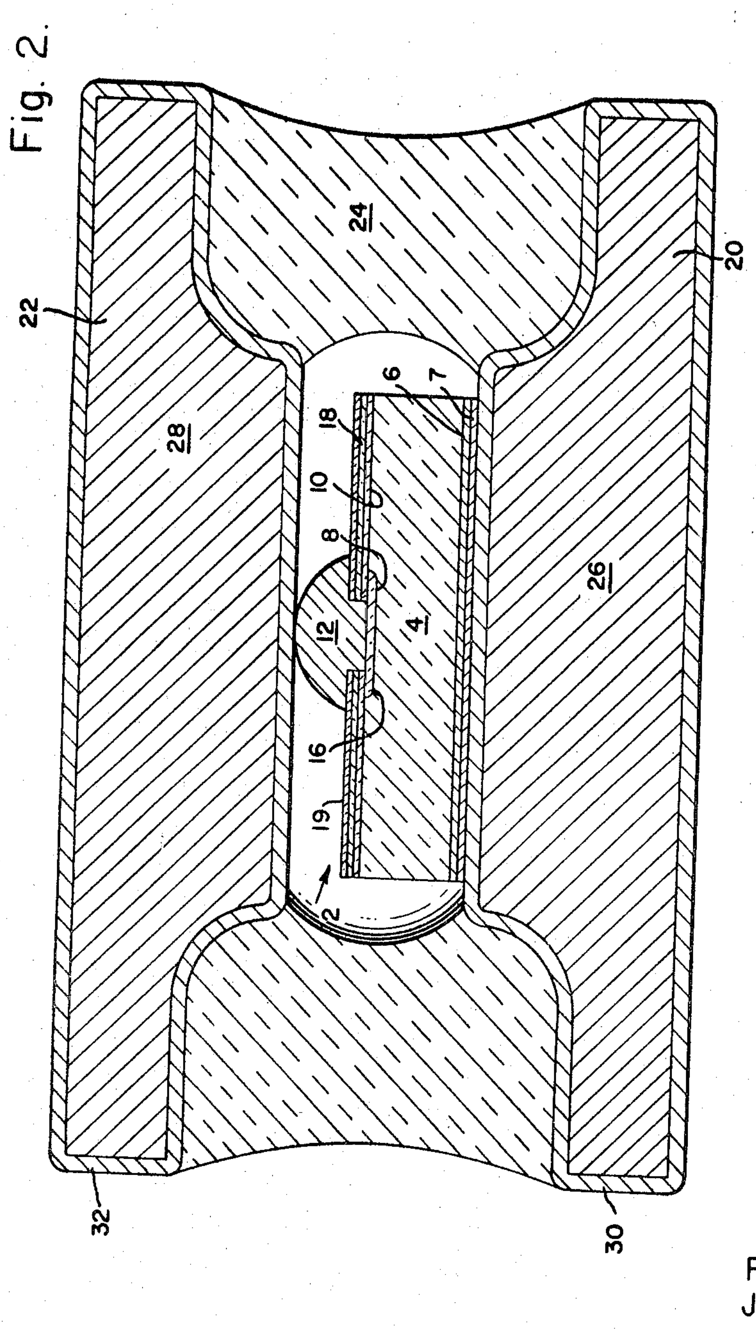
FIGURE 2 is a cross-sectional elevational view of a typical diode device fabricated in accordance with the present invention mounted in a hermetic glass package.
Figure 3:
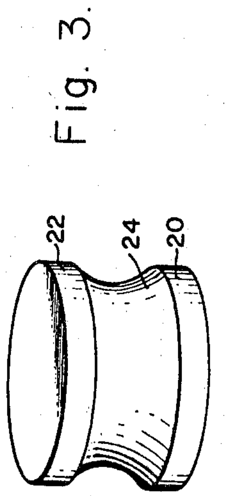
FIGURE 3 is an over-all perspective view of the packaged diode device shown in FIGURE 2.

Referring now to FIGURES 2 and 3, the package or container for the diode device just described comprises a pair of opposed terminal cap members 20 and 22 sealed together at their peripheries by means of a glass body portion or envelope 24 with the semiconductor device 2 therewithin and therebetween. The cap members 20 and 22 are of metal and are each provided with centrally disposed mesa or pedestal portions 26 and 28, respectively.

A suitable glass for the package shown in FIGURE 1 may be a high lead glass identified as "Glass Code 8870" by Corning Glass Works of Corning, N.Y., the manufacturer thereof. The metallic end cap members 20 and 22 may be formed of a glass-sealing metal consisting essentially of an alloy of iron and nickel in equal proportions by weight. During the heating of the glass body 24 in contact with such an alloy element, however, the cap members tend to readily oxidize which would severely reduce the ability to achieve metal-to-metal bonds or soldering action to such end cap members. It has thus been found advantageous to plate these end cap members with silver so as to inhibit or avoid the deleterious effects of such oxidation of the metal of these cap members while at the same time achieving excellent sealing of the glass body part to these cap members. In addition, the silver plating readily bonds with the metals forming the contact portions or connections on the semiconductor device 2. As shown in the drawings, the end cap members 20 and 22 are provided with platings 30 and 32 by conventional silver electroplating techniques over their entire surfaces which plating may be about 0.0007" in thickness.

The package assembly shown in the drawing is achieved by placing the silicon semiconductor device 2 on the pedestal portion 26 of an end cap member 20 with the silver-plated layer 7 of the semiconductor device 2 being in contact with the silver layer 30 on the mesa portion 26 of the cap member 20. The ringlike glass part 24 is then placed on the peripheral portions of the cap member 20 and the upper cap member 22 is placed with its pedestal portion 28 extending downwardly within the glass member 24. The assembly is then placed in an oven or any other desired heating apparatus and raised to a temperature at which the glass body 24 softens and seals to the metallic cap member 20 and 22. During this sealing operation, the glass body 24 loses its heretofore substantially symmetrical, cylindrical shape and tends to slump down to assume more or less the shape shown in the drawing. This slumping down of the glass body 24 permits the upper cap member 22 to drop downwards toward the lower cap member 20 so that the silver-plated pedestal 28 of the upper cap member 22 contacts and bonds to the metal button or "bump" element 12 on the semiconductor device 2. To enhance this action and to ensure that the upper cap member does in fact come down sufficiently to ensure contact to the metal connector 12, it may be desirable to place a weight on the assembly during this heating operation.

Utilizing metal cap members of the aforementioned alloy and a glass body 24 of Corning Glass Number 8870, an hermetically sealed package may be obtained and bonded connections provided between the upper cap member 22 to the connector element 12 and between the lower cap member 20 and the back surface 6 of the semiconductor device by heating the assembly to about 710° C. for three to five minutes.

There thus has been described a novel treatment for protecting diffused junction devices having an oxide layer or layers thereon protecting the surface in which the rectifying junction is terminated. By the treatment of the present invention, such devices are provided with a protective coating or coatings thereon which achieve not only a chemically resistive protective surface but also provide one which is a better thermal match with respect to the bulk silicon body and hence is far less subject to crazing than with devices heretofore protected with silicon oxide layers.

What is claimed is:

1. A semiconductor device comprising a semiconductor body of a first conductivity type, a region in said body having a second type of conductivity forming a rectifying junction with said body terminating at a surface thereof, a first layer of an oxide of said semiconductor body covering said surface and said junction, a layer of glass covering said first layer of oxide and having a coefficient of thermal expansion which more nearly matches the coefficient of expansion of said semiconductor body than the coefficient of expansion of said first oxide layer, a second layer of oxide of the same type as said first layer of oxide covering said layer of glass, said layer of glass being thicker than said second layer of oxide, and an electrical contact to said region in said body extending thereto through openings in said layers.

2. A semiconductor device comprising a silicon body of a first conductivity type, a region in said silicon body having a second type of conductivity and forming a rectifying junction therewith which terminates at a surface thereof, a first layer of silicon oxide formed from said silicon body and covering said surface, a layer of glass covering said layer of said silicon oxide and having a coefficient of thermal expansion which more nearly matches the coefficient of expansion of said silicon body than the coefficient of expansion of said silicon oxide layer, a second layer of silicon oxide covering said layer of glass, said layer of glass being thicker than said second layer of silicon oxide, and an electrical contact to said region in said body extending thereto through openings in said layers.

3. The invention according to claim 2 wherein said first silicon oxide layer is about 1.5 microns thick, said second layer of silicon oxide is about .4 micron thick and said glass layer is about 1.5 microns thick.

4. A semiconductor device comprising a silicon body of a first conductivity type, a region in said silicon body of opposite conductivity type to said first conductivity type and forming a rectifying junction with said body which terminates at a surface thereof, a first layer of silicon oxide formed from said silicon body and covering said surface, a layer of borosilicate covering said layer of oxide and having a coefficient of thermal expansion which more nearly matches the coefficient of expansion of said silicon body than the coefficient of expansion of said silicon oxide layer, a second layer of silicon oxide covering said layer of borosilicate, said borosilicate layer being thicker than said second layer of silicon oxide, and an electrical contact to said region in said body extending thereto through openings in said layers.

5. The invention according to claim 4 wherein said electrical contact comprises a metal fill which extends above and over a predetermined portion of said second layer of silicon oxide.

6. A semiconductor apparatus comprising, in combination, a container having an insulating wall portion and metal end caps, a silicon body having a first type of conductivity disposed in said container and having a first surface in electrically conducting relationship with one of said end caps, a region in said silicon body of opposite conductivity type to said first type and forming a rectifying junction with said silicon body terminating at a second surface thereof, a first layer of oxide formed from said silicon body and covering said second surface and said junction, a layer of glass covering said layer of said silicon oxide and having a coefficient of thermal expansion which more nearly matches the coefficient of expansion of said silicon body than the coefficient of expansion of said silicon oxide layer, a second layer of silicon oxide covering said layer of glass, said glass layer being thicker than said second layer of silicon oxide, an electrical contact to said region in said silicon body extending thereto through openings in said layers, and in electrically conducting relationship with the other of said end caps.

7. The invention according to claim 6 wherein said layer of glass consists essentially of borosilicate.

8. The invention according to claim 6 wherein said glass layer consists essentially of borosilicate and is thicker than said second layer of oxide.

9. A semiconductor apparatus comprising, in combination, a container having an insulating wall portion and electrically conductive end caps, an N-type silicon body disposed in said container and having a first surface in electrically conducting relationship with one of said end caps, a P-type region in said silicon body forming a rectifying junction therewith which terminates at a second surface thereof, and a first layer of silicon oxide covering said second surface of said junction, a layer of glass covering said first layer of said silicon oxide and having a coefficient of thermal expansion which more nearly matches the coefficient of expansion of said silicon body than the coefficient of expansion of said first oxide layer, a second layer of silicon oxide covering said layer of glass, said glass layer being much thicker than said second layer of oxide, and an electrical contact to said P-type region extending thereto through said openings in said layers and in electrically conducting relationship with the other of said end caps.

References Cited

UNITED STATES PATENTS

| | | | |
|---|---|---|---|
| 3,334,281 | 8/1967 | Ditrick | 317—235 |
| 3,343,049 | 9/1967 | Miller et al. | 317—235 |
| 3,226,614 | 12/1965 | Haenichen | 317—235 |
| 3,247,428 | 4/1966 | Perri et al. | 317—235 |
| 3,298,879 | 1/1967 | Scott et al. | 317—235 |

OTHER REFERENCES

Vectors "Microglass," Hughes Aircraft Company, vol. 7, No. 1, May 6, 1964, pp. 11 and 13.

JOHN W. HUCKERT, *Primary Examiner.*

J. D. CRAIG, *Assistant Examiner.*

U.S. Cl. X.R.

174—52